United States Patent
Chao et al.

(10) Patent No.: US 6,671,847 B1
(45) Date of Patent: Dec. 30, 2003

(54) I/O DEVICE TESTING METHOD AND APPARATUS

(75) Inventors: Chi-Yeu Chao, Portland, OR (US); Tawfik R. Arabi, Tigard, OR (US); Thomas D. Barrett, Hillsboro, OR (US); Gregory F. Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 334 days.

(21) Appl. No.: 09/709,000

(22) Filed: Nov. 8, 2000

(51) Int. Cl.$^7$ ................................................. G06F 11/00
(52) U.S. Cl. ........................................ 714/744; 714/731
(58) Field of Search ................................ 714/729, 745, 714/25, 744, 43, 731

(56) References Cited

U.S. PATENT DOCUMENTS 6,308,291 B1 * 10/2001 Kock et al. .................. 714/729
6,381,722 B1 * 4/2002 Salmon et al. ............... 714/745
6,385,739 B1 * 5/2002 Barton et al. .................. 714/25
6,421,801 B1 * 7/2002 Maddux et al. .............. 714/744
6,449,738 B1 * 9/2002 Hinedi et al. .................. 714/43

* cited by examiner

*Primary Examiner*—David Ton
(74) *Attorney, Agent, or Firm*—Schwegman, Lundberg, Woessner & Kluth, P.A.

(57) ABSTRACT

An integrated circuit includes circuitry to test input/output (I/O) devices. Test data is provided to a loopback circuit that drives data through the output buffer to the pad, and back onto the integrated circuit through the input buffer. Separate clock signals, with varying phase, are generated for input synchronous elements and output synchronous elements. The phase, and the relative time delay between the separate clocks, changes as an external clock is varied. The external clock is varied to verify the performance parameters of the I/O devices. Each I/O device includes a shift register that can be coupled to the other buffers in a chain, or can be configured to be in a loop.

23 Claims, 8 Drawing Sheets

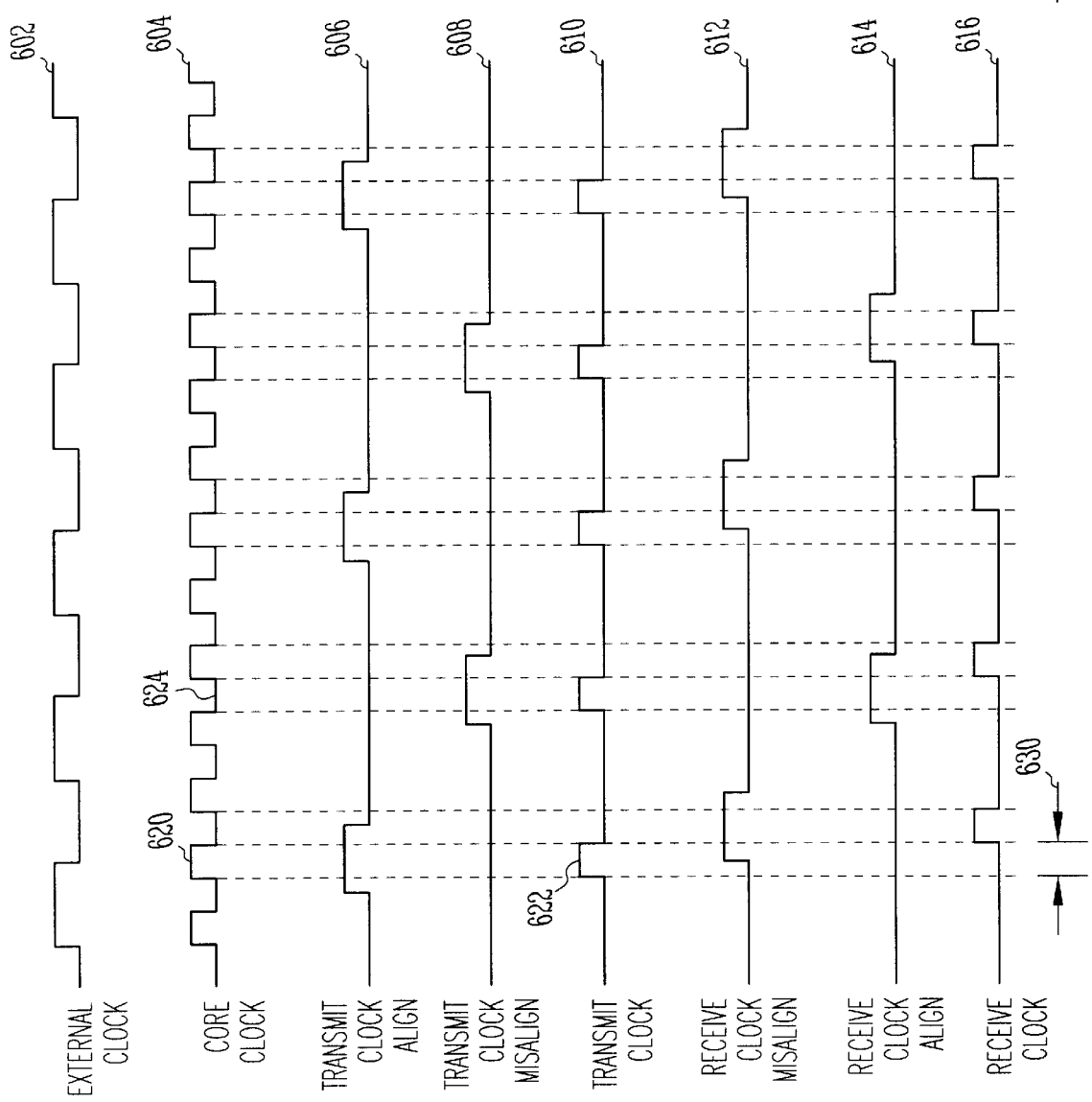

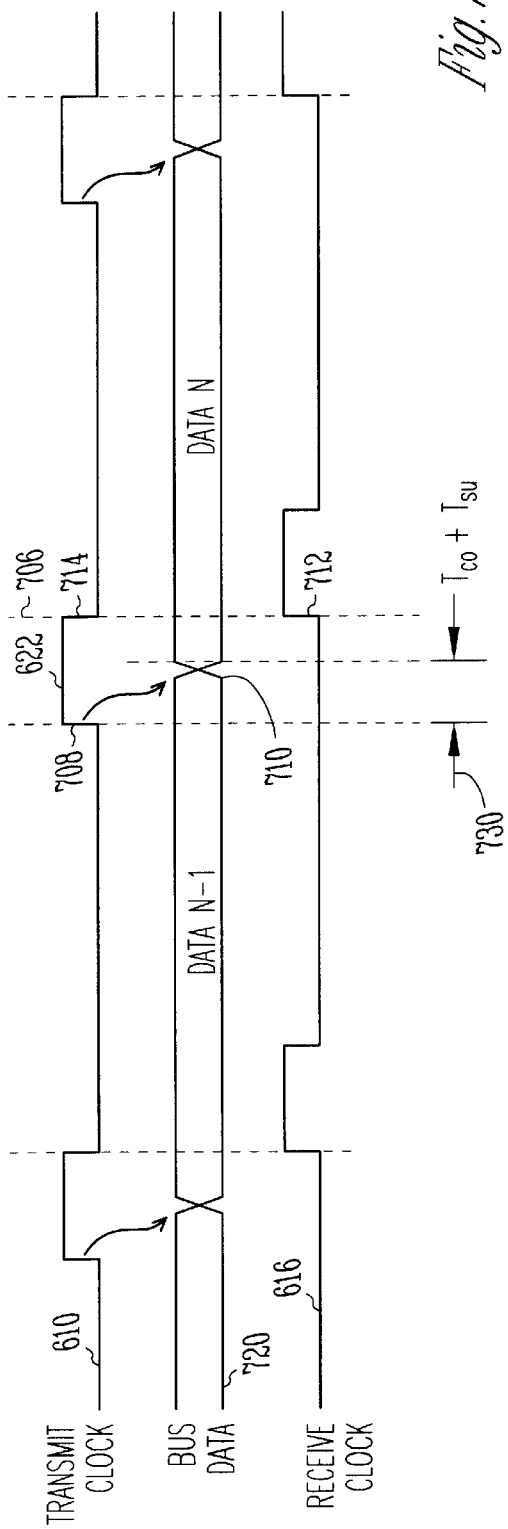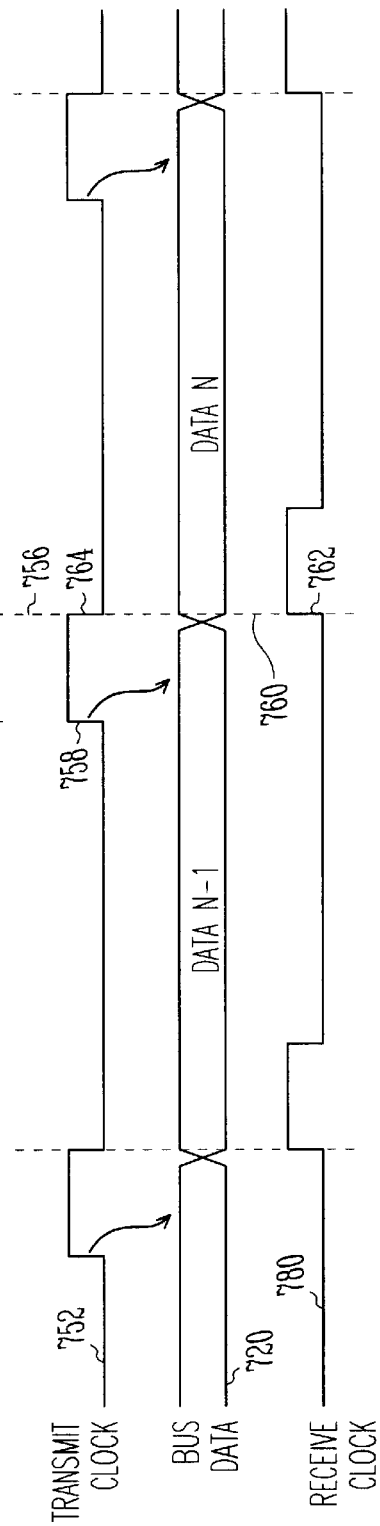

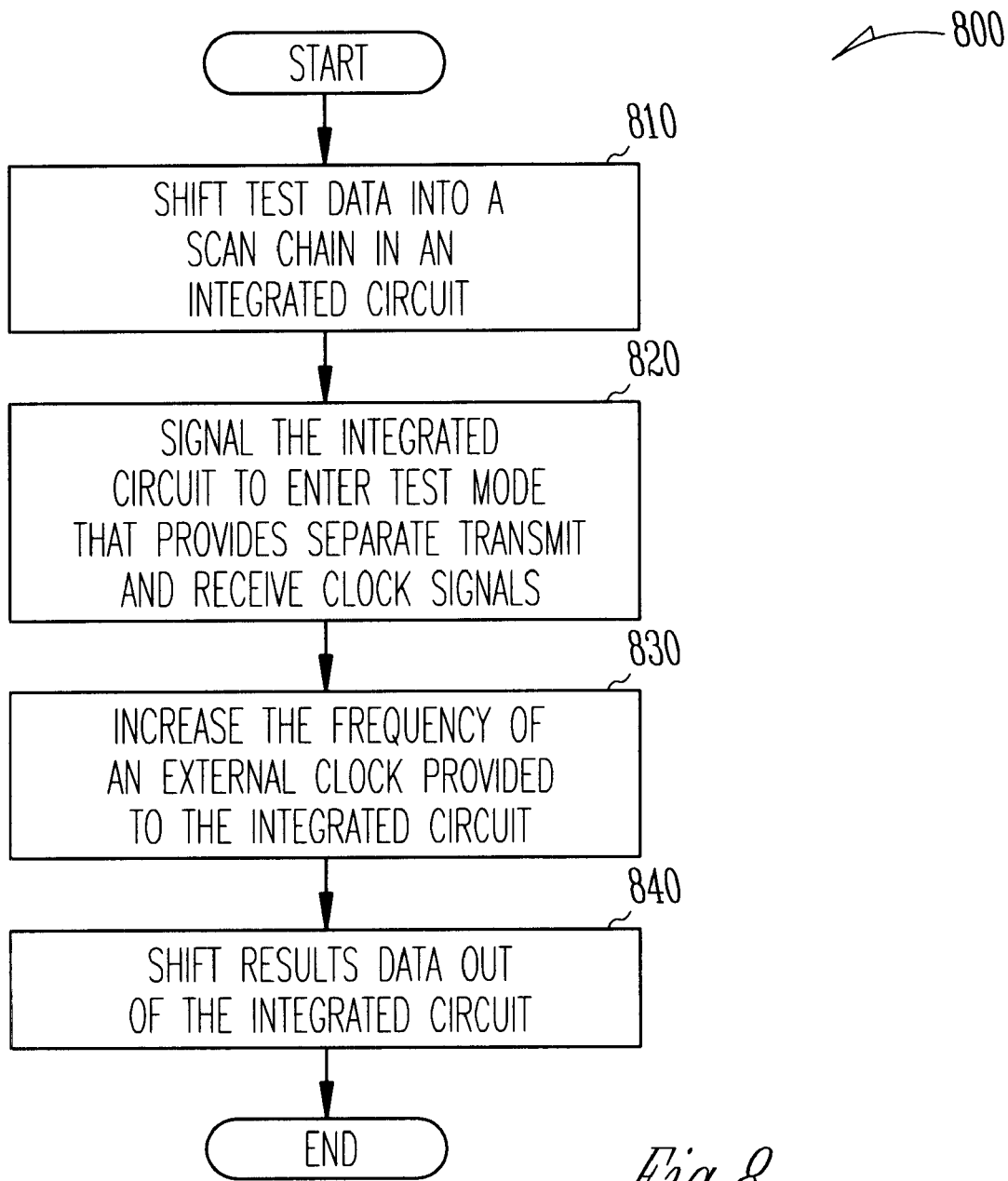

I/O DEVICE TESTING METHOD AND APPARATUS

FIELD

The present invention relates generally to input/output (I/O) devices in integrated circuits, and more specifically to the testing of I/O devices in integrated circuits.

BACKGROUND

As integrated circuits become faster, they also become harder to test. Timing characteristics of I/O devices are one example of integrated circuit timing parameters that become more difficult to test as integrated circuits becomes faster. I/O devices have traditionally been tested by coupling a component tester to the integrated circuit to test I/O device timing parameters. Clock-to-output times (Tco) are measured by sampling an output signal for valid data and measuring a time distance between the clock signal and the valid data. Data setup times (Tsu) are measured by providing valid data at various times relative to a known clock signal. The precision with which these tests are performed are limited in part by the timing uncertainties of the component tester. Some I/O devices are becoming so fast that timing uncertainties in component testers represent an unacceptably large percentage of the total time budgeted, and the component tester causes otherwise good parts to fail tests.

FIG. 1 shows a prior art integrated circuit and component tester. Integrated circuit 100 includes data-out latch 102, output driver 104, signal pad 110, input receiver 108, and data-in latch 106. Data-out latch 102 and output driver 104 form the data output path for output data on node 116 to reach signal pad 110. Output data 116 is sourced by circuits internal to integrated circuit 100, and signal pad 110 provides access off of integrated circuit 100. Tco is measured as the time between the assertion of the front side bus clock on node 120 and valid data appearing on signal pad 110. Tco is shown by arrow 112 in FIG. 1. Input receiver 108 and data-in latch 106 form the input path for input data traveling from signal pad 110 to input data node 118. Tsu is measured as the minimum necessary time between valid data appearing on signal pad 110 and the assertion of the front side bus clock on node 120. Tsu is shown in FIG. 1 by arrow 114.

Coupled to integrated circuit 100 is component tester 130. Component tester 130 receives output data from signal pad 110, and sources input data to signal pad 110. Component tester 130 typically includes timing uncertainties, and these timing uncertainties are taken into account when designing tests. Timing tests typically include a timing budget that allocates a maximum timing error to the component tester. The prior art system of FIG. 1 works well when timing uncertainties within component tester 130 represent a very small amount of the timing budget. In contrast, when timing uncertainties within the component tester represent a large amount of the timing budget, it becomes difficult to design an effective test. For the fastest available integrated circuits today, many component testers have timing uncertainties that exceed allowable limits as specified in timing budgets.

For the reasons stated above, and for other reasons stated below which will become apparent to those skilled in the art upon reading and understanding the present specification, there is a need in the art for improved methods and apparatus to test fast integrated circuits.

BRIEF DESCRIPTION OF THE DRAWINGS

FIG. 6 is a timing diagram showing the operation of the two clock generator circuits of FIG. 5;

FIGS. 7A and 7B are timing diagrams showing transmit and receive clocks used in testing; and FIG. 8 is a flowchart of a method of testing an integrated circuit.

DESCRIPTION OF EMBODIMENTS

Figure 1:
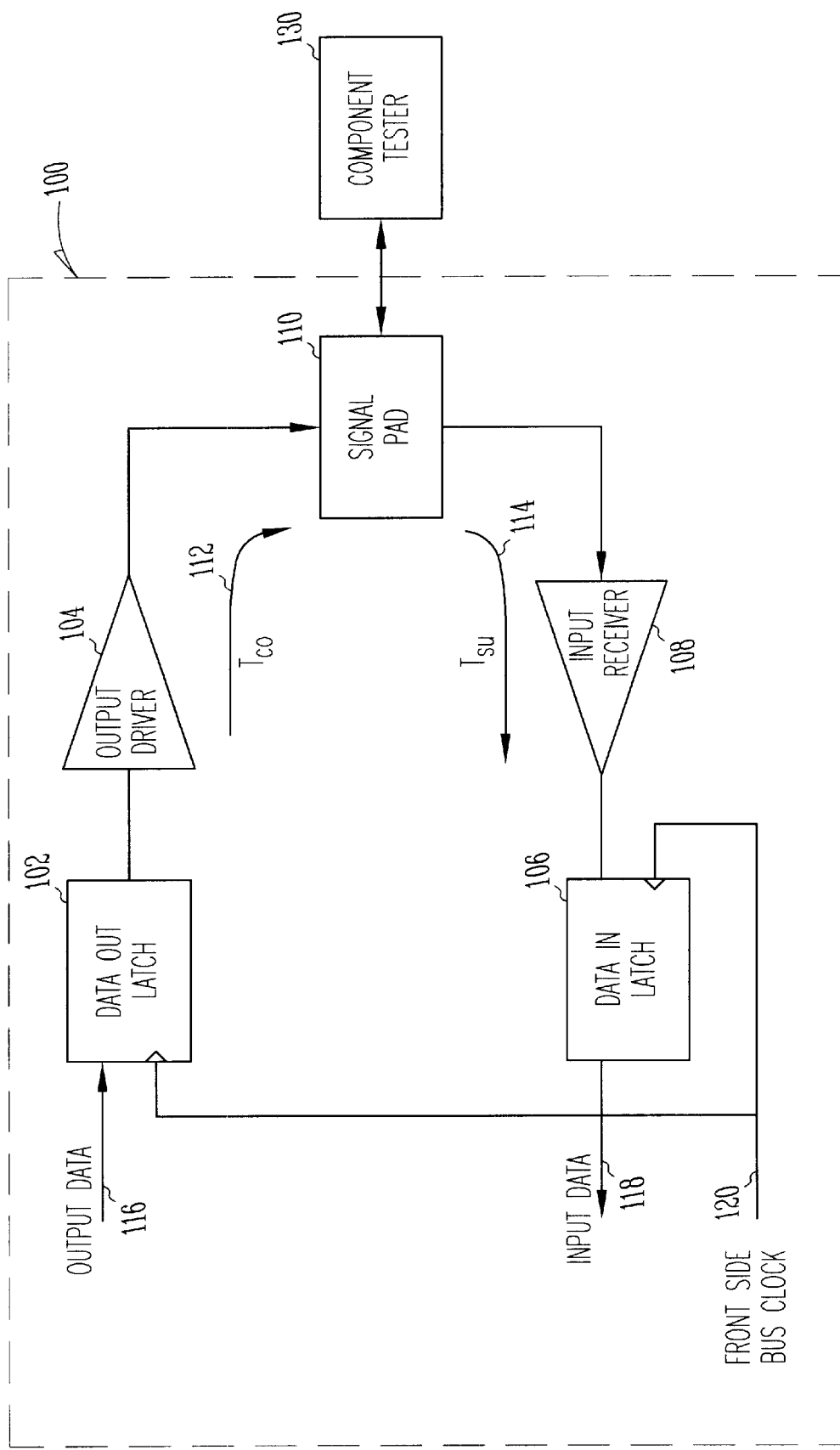
FIG. 1 shows a prior art integrated circuit and a component tester.

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism to utilize internally generated clock signals to test timing characteristics of I/O devices in an integrated circuit. The integrated circuit includes two front side bus clock generator circuits, one to generate a transmit clock signal, and one to generate a receive clock signal. During normal operation, both the transmit clock signal and receive clock signal are generated in the same manner. During test, the receive clock signal is generated with an apparent time delay relative to the transmit clock signal. Various timing parameters, including the clock to output time (Tco) and the data set up time (Tsu) can then be tested by varying the delay between the two clock signals and comparing output data and input data. Test data can be shifted in on a scan chain, and results can be shifted out on the same or a different scan chain.

Figure 2:
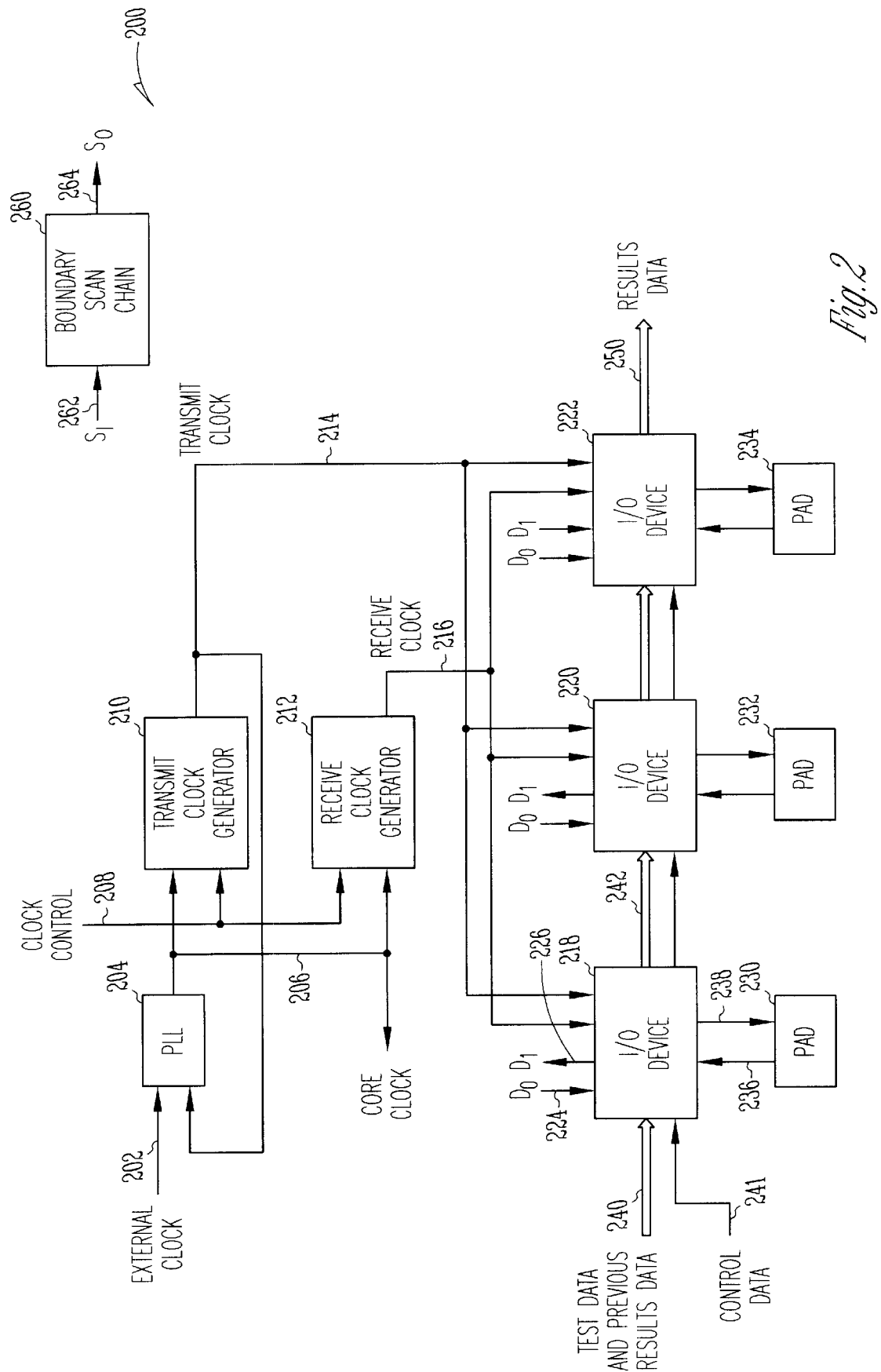
FIG. 2 shows an integrated circuit.

FIG. 2 shows an integrated circuit. Integrated circuit 200 includes phase lock loop (PLL) 204, transmit clock generator 210, receive clock generator 212, I/O devices 218, 220, and 222, pads 230, 232, and 234, and boundary scan chain 260. Transmit clock generator 210 and receive clock generator 212 are variable clock circuits that generate a transmit clock signal on node 214 and a receive clock signal on node 216, respectively. The transmit clock signal and the receive clock signal are received by I/O devices 218, 220, and 222. Embodiments of transmit clock generator 210 and receive clock generator 212 are described with reference to FIG. 5 below, and an embodiment of I/O device 218 is described with reference to FIG. 3 below.

Integrated circuit 200 can be any type of circuit that utilizes I/O devices. For example, integrated circuit 200 can be a microprocessor, a microprocessor peripheral, a memory controller, a memory device, or the like. In some embodiments, such as in embodiments where integrated circuit 200 is a microprocessor, transmit clock generator 210 and receive clock generator 212 are referred to as "front side bus clock generators." "Front side bus clock generator" is a term used to differentiate the speed at which the I/O devices operate from the speed at which the internal circuitry operates.

Pads 230, 232, and 234 are I/O pads that function to provide a signal path to and from integrated circuit 200. For example, I/O device 218 receives output data on node 224 and passes that output data to pad 230 on node 238. Likewise, when pad 230 receives input data, the input data is provided to I/O device 218 on node 236. I/O devices 220 and 222 operate in a similar manner.

In operation, an external clock signal is received on node 202. This external clock signal can be received from any source, and in some embodiments is provided to integrated circuit 200 by the system that incorporates integrated circuit 200. For example, in some embodiments, integrated circuit 200 is a microprocessor that receives an external clock signal from a motherboard to which it is affixed. PLL 204 receives the external clock signal and the transmit clock signal on node 214 as generated by transmit clock generator 210, and produces a core clock signal on node 206. PLL 204 can create core clock signal having a higher frequency, a lower frequency, or the same frequency as the external clock signal. In some embodiments, the core clock signal on node 206 is fanned out across most or all of integrated circuit 200, and is used to clock many sequential elements. Transmit clock generator 210 and receive clock generator 212 receive the core clock signal on node 206 and generate the transmit clock signal and the receive clock signal. PLL 204 substantially matches the phase of the external clock signal on node 202 with the phase of the transmit clock signal on node 214. This allows synchronous communications between external devices clocked by the external clock signal and elements within integrated circuit 200 that are clocked by the transmit clock signal.

When integrated circuit 200 is operational in an end-user system, transmit clock generator 210 and receive clock generator 212 generate the transmit clock signal and receive clock signal in substantially the same manner, such that both have substantially the same phase. When integrated circuit 200 is undergoing tests, however, transmit clock generator 210 and receive clock generator 212 generate clock signals having a different phase relationship. This phase relationship (also referred to as "an apparent time delay") is described in more detail below with reference to FIGS. 6 and 7A–7B.

The I/O devices include loopback circuitry capable of utilizing the transmit clock signal and receive clock signal to test timing parameters associated with the I/O device. The I/O devices receive test data, perform tests using internal loopback circuitry, and produce test results data. Timing tests that measure timing parameters such as the sum of Tco and Tsu can be performed as the apparent time delay is varied between the transmit clock signal and the receive clock signal. An I/O device embodiment and an associated loopback circuit embodiment are described with reference to FIGS. 3 and 4 below.

The I/O devices are connected as part of at least one scan chain. As shown in FIG. 2, I/O device 218 receives test data and previous results data on node 240 and control data on node 241. In some embodiments, node 240 represents the connections for a single scan chain, and both test data and results data from a previous I/O device in the scan chain are multiplexed onto the same scan chain. In other embodiments, node 240 represents the connections for multiple scan chains; one for the test data, and one for the results data. The scan chain that carries test data is referred to herein as the "padscan" chain. The padscan chain travels from one I/O device to the next as shown in FIG. 2, and can carry test data alone, or can carry both test data and results data. Control data is shown on node 241. In some embodiments, control data is shifted from one I/O device to another in much the same manner as the padscan chain. In other embodiments, the control data is fanned out to each I/O device in parallel.

In addition to receiving test data and results from previous I/O devices, each I/O device also produces test results. Results data is shifted out of the I/O devices as shown in FIG. 2 on node 250. The results data travels from one I/O device to the next in the scan chain. As described above, in some embodiments, the results data scan chain is the same as the padscan chain, and in other embodiments, the results data scan chain is separate from the padscan chain.

Integrated circuit 200 is shown having three I/O devices for clarity. In some embodiments, integrated circuit 200 includes hundreds of I/O devices, and in other embodiments, integrated circuit 200 includes thousands of I/O devices.

Also shown in FIG. 2 is boundary scan chain 260. Boundary scan chain 260 includes a shift in (SI) bit on node 262 and a shift out (SO) bit on node 264. Boundary scan chain 260 includes many sequential elements internal to integrated circuit 200 that receive test data and shift out results data. In some embodiments, boundary scan chain 260 is coupled in series with the padscan chain to create one large scan chain, and in other embodiments, boundary scan chain 260 is separate from the padscan chain.

Figure 3:
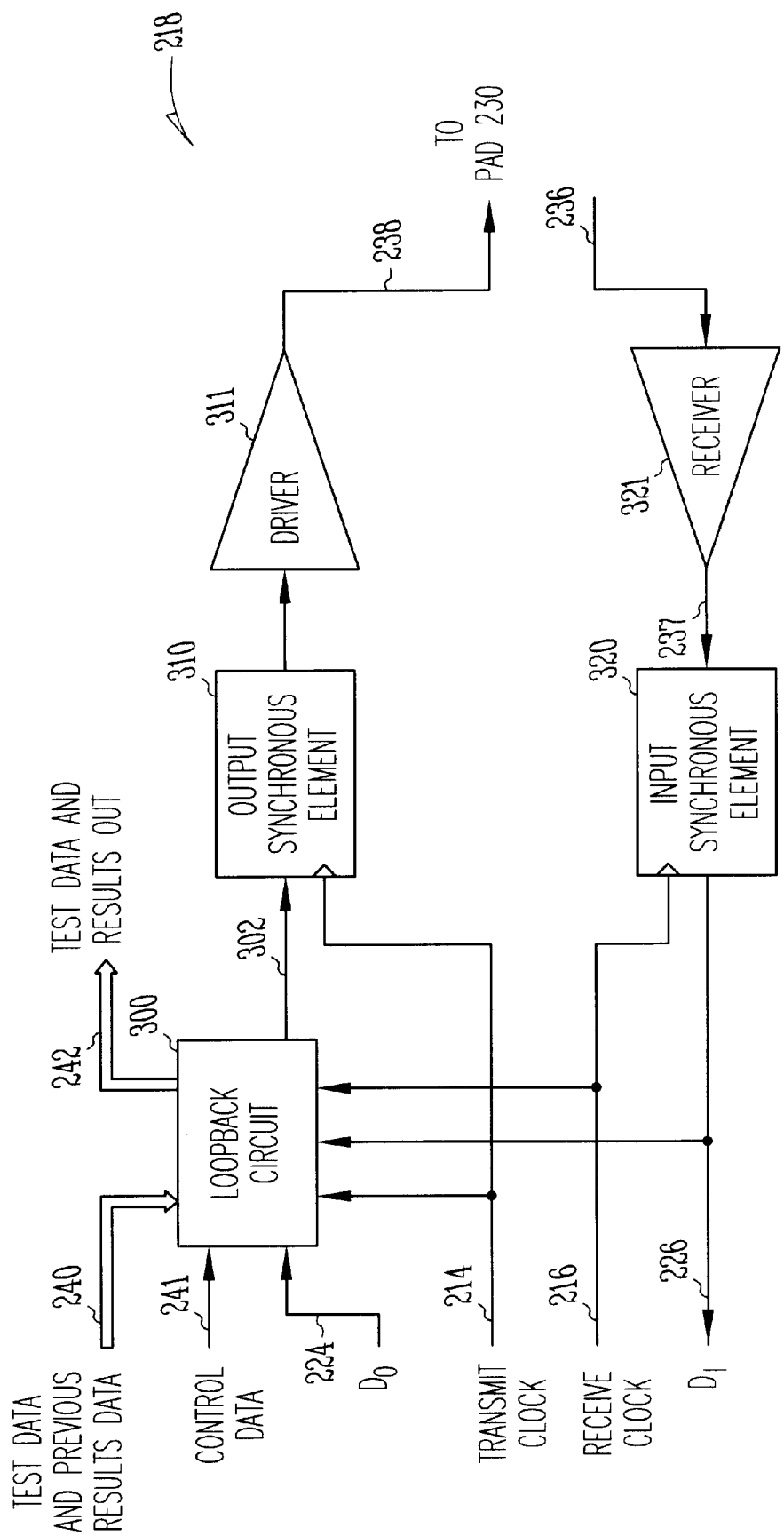
FIG. 3 shows an I/O device with a loopback circuit.

FIG. 3 shows an I/O device with a loopback circuit. I/O device 218 includes loopback circuit 300, output synchronous element 310, driver 311, receiver 321, and input synchronous element 320. Output synchronous element 310 can be any type of element capable of producing data on node 238 as a function of the transmit clock signal. Examples include D flip-flops, transparent latches and other known synchronous elements. Input synchronous element 320 can also be any of these types of synchronous elements. For ease of explanation, output synchronous element 310 and input synchronous element 320 are described herein as positive edge triggered D flip-flops.

Output synchronous element 310 receives data on node 302 and receives the transmit clock signal on node 214. When the transmit clock signal transitions from low to high, the data on node 302 is driven on to node 238, which then drives pad 230 (FIG. 2). Input synchronous element 320 receives input data on node 236 from pad 230, and also receives the receive clock signal on node 216. On the rising edge of the receive clock signal, input synchronous element 320 captures the data present on node 236, and drives it onto node 226.

Loopback circuit 300 receives data on node 240 and transmits data on node 242. In some embodiments, nodes 240 and 241 each represent multiple physical signal lines. For example, in some embodiments, node 240 includes one signal line to receive test data and another to receive results data, both from an earlier I/O device in the scan chain. Also for example, in some embodiments, node 242 includes one signal line to transmit test data, and another to transmit results data, both to a later I/O device in the scan chain. Loopback circuit 300 receives output data (Do) on node 224 and drives data onto node 302. During normal operation, the output data present on node 224, which comes from within the integrated circuit, is driven onto node 302. During test of the integrated circuit, however, test data received on node 240 is driven onto node 302 by loopback circuit 300. This test data propagates through output synchronous element 310 and driver 311 to pad 230 (FIG. 2), and then loops back on node 236 through receiver 321 to input synchronous element 320. Also during test, the receive clock signal on node 216 has an apparent time delay relative to the transmit clock signal on node 214. Loopback circuit 300 receives both clock signals, and also receives the data driven onto node 226. Loopback circuit 300 compares the test data with the data on node 226, and generate results data to be shifted out.

Figure 4:
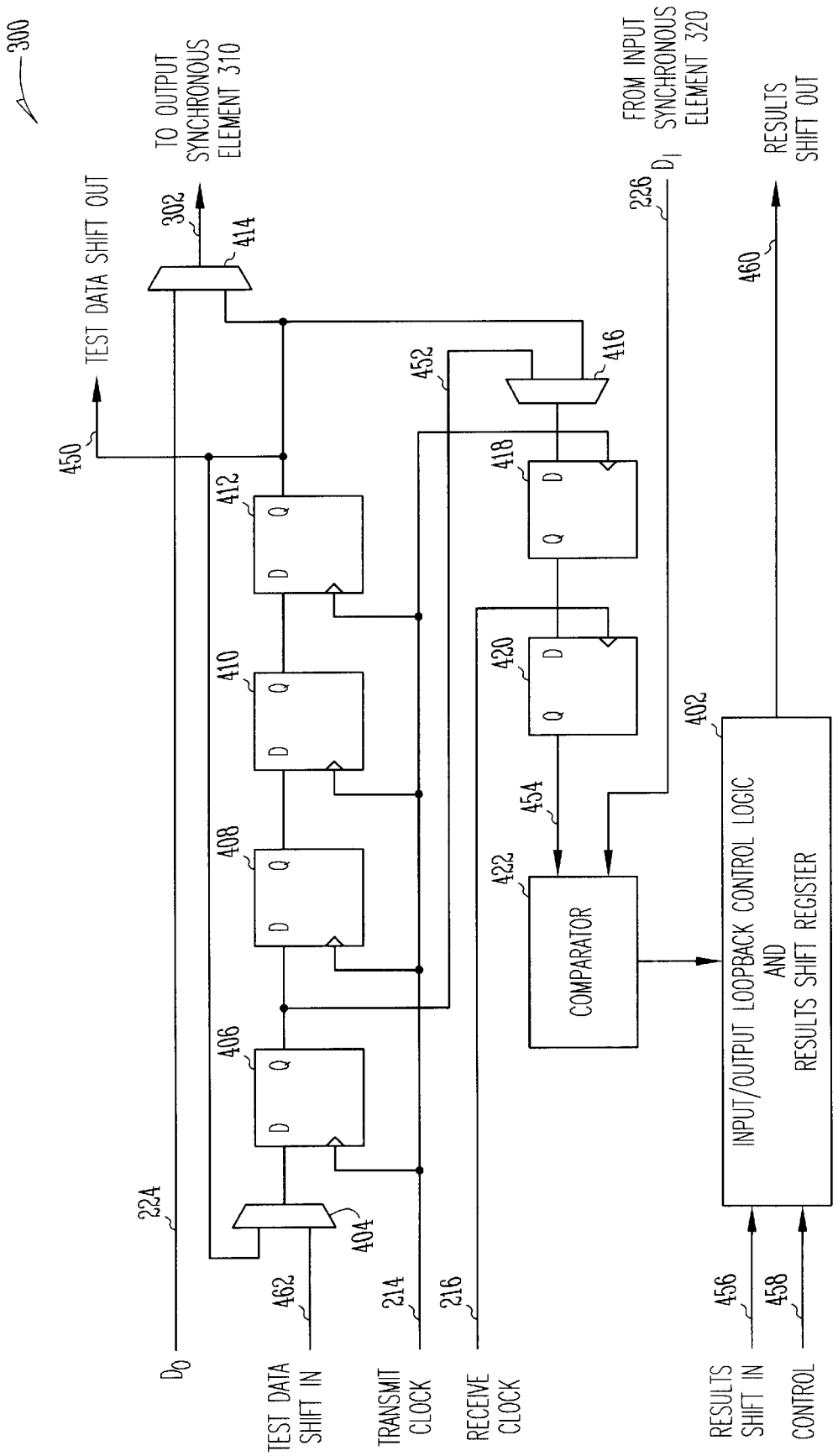
FIG. 4 shows a loopback circuit.

FIG. 4 shows a loopback circuit. Loopback circuit 300 includes a test data shift register that includes flip-flops 406, 408, 410, and 412. These flip-flops are part of the padscan chain. In the embodiment of FIG. 4, four flip-flops are shown within loopback circuit 300. In other embodiments, many more than four flip-flops are utilized. In operation, test data is shifted in on node 462 and is shifted out on node 450. The test data shift register also includes a circular path that, when engaged, re-circulates data through the shift register to form a pattern generator. For example, when multiplexer 404 passes data from node 450 to flip-flop 406, the test data within the test data shift register re-circulates. Each of the flip-flops within the test data shift register receives the transmit clock signal on node 214.

Loopback circuit 300 receives data on node 224 and drives data to output synchronous element 310 (FIG. 3) on node 302. Multiplexer 414 can pass either the data on node 224 as just described, or can pass test data from node 450 to output synchronous element 310. Loopback circuit 300 receives data from input synchronous element 320 (FIG. 3) on node 226 and provides it to comparator 422. Comparator 422 compares data received from input synchronous element 320 with data on node 454.

The data on node 454 is test data retrieved from the test data shift register. The test data shift register includes multiple stages, and comparator 422 can receive test data from any of the stages. In the embodiment shown in FIG. 4, comparator 422 can receive test data through multiplexor 416 from one of two stages: those driven by flip-flops 406 and 412.

Comparator 422 compares test data on node 454 with input data on node 226 and provides results to the input/output loopback control logic and results shift register 402, which receives results data shifted in on node 456, control information on node 458, and shifts results data out on node 460. As previously described, results data can be multiplexed with test data such that the test data and results data are combined on a single scan chain. In the embodiment shown in FIG. 4, a separate padscan chain and results scan chain exist.

When the integrated circuit is in normal operation, and not undergoing test, multiplexer 414 drives data from node 224 onto node 302. When integrated circuit is undergoing test, multiplexer 414 drives test data from node 450 onto node 302. Also during test, multiplexor 404 can either re-circulate data within the test data shift register, or can allow test data being shifted in to pass into the test data shift register. Test data on either node 450 or node 452 is looped back through multiplexor 416 to flip flops 418 and 420, which provides the test data to comparator 422 on node 454.

Multiplexors 404, 414, and 416 are controlled using control logic within input/output loopback control logic and results shift register 402. When an integrated circuit that includes loopback circuit 300 begins a test, control signals on node 458 cause the control logic to steer the multiplexors in the appropriate manner. In some embodiments, control signals received on node 458 control the multiplexors directly, and in other embodiments, control signals received on node 458 drive a state machine which controls the multiplexors.

The generation of the clock signals is described below with reference to FIGS. 5 and 6, and the use of these clock signals to perform testing is described with reference to FIGS. 7A, 7B, and 8.

Figure 5:
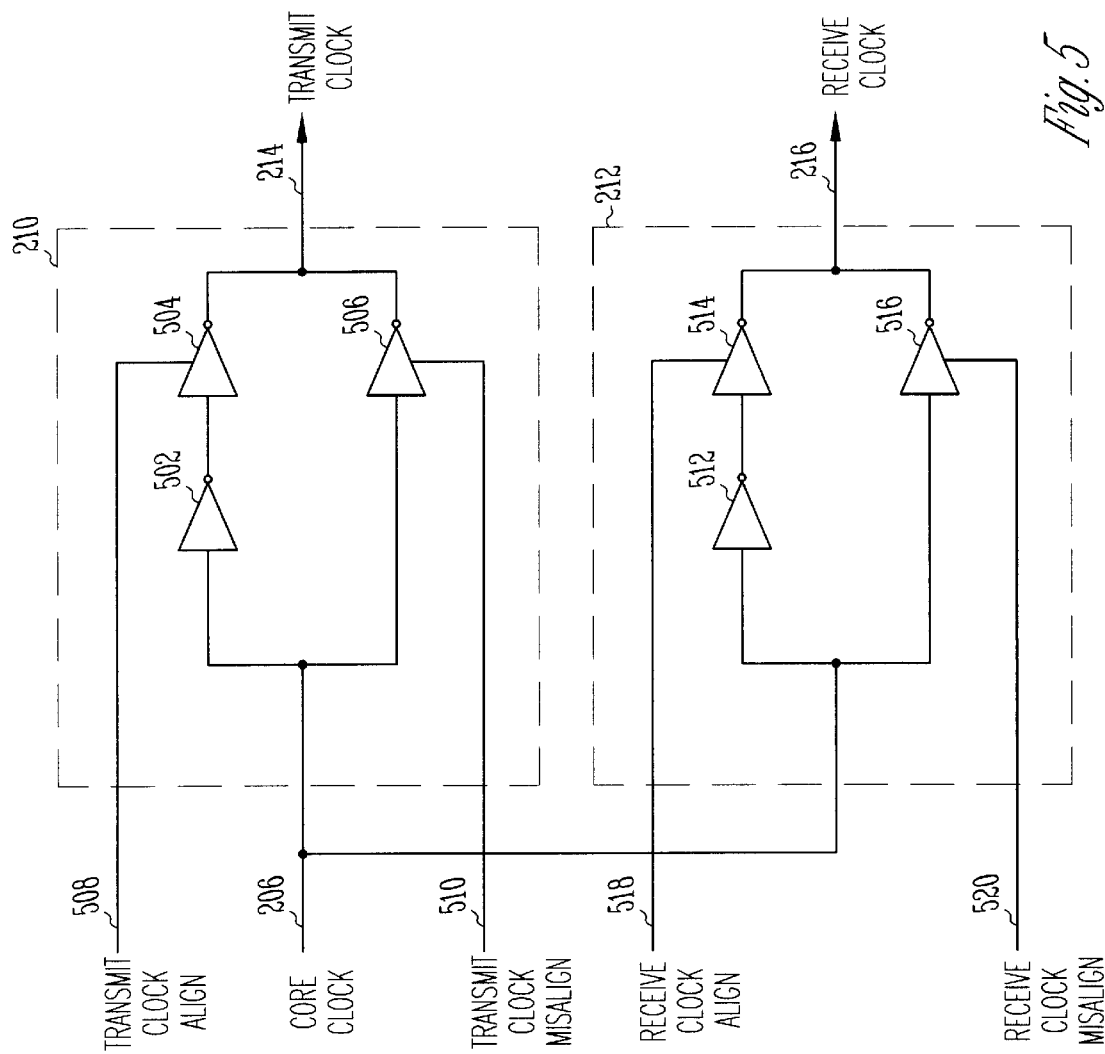
FIG. 5 shows two clock generator circuits.

FIG. 5 shows two clock generator circuits, transmit clock generator 210 and receive clock generator 212. Transmit clock generator 210 and receive clock generator 212 are variable clock generators that receive the core clock signal on node 206 and generate clock signals to be used by I/O devices. Transmit clock generator 210 and receive clock generator 212 operate independently, and can generate substantially identical clock signals, or can generate clock signals having apparent time delays relative to each other.

Transmit clock generator 210 includes inverters 502, 504, and 506. Inverters 504 and 506 include output devices capable of creating a high impedance output. For example, when the transmit clock align signal on node 508 is asserted, inverter 504 drives the transmit clock signal node 214, and when the transmit clock align signal on node 508 is deasserted, inverter 504 presents a high impedance to transmit clock signal node 214. Also for example, when the transmit clock misalign signal on node 510 is asserted, inverter 506 drives transmit clock signal node 214, and when transmit clock misalign signal on node 510 is deasserted, inverter 506 presents a high impedance on transmit clock signal node 214.

Receive clock generator 212 includes inverters 512, 514, and 516. Inverters 514 and 516 are inverters capable of presenting a high impedance output. Inverters 514 and 516 have high impedance outputs controlled by the receive clock align signal on node 518 and the receive clock misalign signal on node 520, respectively.

In operation, the transmit clock signal on node 214 is generated as a composite signal output from inverters 504 and 506. When the transmit clock align signal on node 508 is asserted, a non-inverted and slightly delayed version of the core clock on node 206 is presented on transmit clock signal node 214. When the transmit clock misalign signal on node 510 is asserted, an inverted and slightly delayed version of the core clock on node 206 is presented on transmit clock signal node 214. The receive clock signal is generated in the same manner by receive clock generator 212 but with separate control signals. When the transmit clock align signal and the receive clock align signal are the same, and when the transmit clock misalign signal and the receive clock misalign signal are the same, the transmit clock signal on node 214 and the receive clock signal on node 216 are also the same.

The transmit align and misalign signals and the receive align and misalign signals are control signals that are generated using known mechanisms. In some embodiments, the control signals are active high, while in other embodiments, the control signals are active low. In the remainder of this description, the control signals are described as active high signals. That is, the control signals are asserted when they are high, and the inverters that they control are in a high impedance state when they are low. In some embodiments, weak pullup or pulldown devices are coupled to transmit clock signal node 214 and receive clock signal node 216 to keep the clock signal nodes from floating.

FIG. 6 is a timing diagram showing the operation of the two clock generator circuits of FIG. 5. FIG. 6 also shows one embodiment of the relationship between external clock signal 602 and core clock signal 604. In this example, core clock signal 604 is generated by PLL 204 (FIG. 2) at 2.5 times the frequency of external clock signal 602. Transmit clock signal 610 is generated from core clock signal 604, transmit clock align signal 606, and transmit clock misalign signal 608. As can be seen in FIG. 6, transmit clock align signal 606 is asserted during pulse 620 of core clock signal 604. Pulse 620 of core clock signal 604 is a positive half-period of core clock signal 604. Pulse 622 of transmit clock signal 610 is produced as a result. Transmit clock misalign signal 608 is asserted during pulse 624, which is a negative half-period of core clock signal 604.

Receive clock signal 616 is generated from core clock signal 604, receive clock align signal 614, and receive clock misalign signal 612. As shown in FIG. 6, receive clock align signal 614 is offset from transmit clock misalign signal 608 by one half period of core clock 604. Likewise, receive clock misalign signal 612 is offset from transmit clock align signal 606 by one half period of core clock 604. As a result, receive clock signal 616 is a waveform substantially similar to transmit clock signal 610, delayed by one half period of clock 604. Apparent time delay 630 is shown as the time delay between transmit clock signal 610 and receive clock signal 616. Apparent time delay 630, being a function of the period of core clock signal 604, decreases as the frequency of core clock signal 604 increases. Likewise, apparent delay 630 increases as the frequency of core clock signal 604 decreases.

In the embodiment shown in FIG. 6, receive clock signal 616 has an apparent time delay relative to transmit clock signal 610, and the apparent time delay is equal to one half period of core clock 604. Different time delays can be achieved by modifying the timing of the align signals and misalign signals. For example, receive clock signal 616 can be produced with more or less apparent delay by modifying receive clock misalign signal 612 and receive clock align signal 614.

Transmit clock signal 610 and receive clock signal 616 as shown in FIG. 6 are clock signals useful during testing. During normal operation, transmit clock signal 610 and receive clock signal 616 have substantially the same phase, and the apparent time delay between the two clock signals is substantially zero.

FIGS. 7A and 7B are timing diagrams showing transmit and receive clocks used in testing. FIG. 7A shows transmit clock 610, receive clock signal 616, and bus data signal 720. Referring now back to FIG. 3, bus data signal 720 represents data on node 237 that is input to input synchronous element 320 and clocked by the receive clock signal on node 216. Transmit clock signal 610 is the transmit clock signal on node 214 that clocks output synchronous element 310, causing data on node 302 to be driven on node 238. Receive clock signal 616 is the receive clock signal that clocks input synchronous element 320 to capture bus data 720 present on node 237.

As shown in FIG. 7A, data on bus data signal 720 changes as a result of a rising edge on transmit clock signal 610. For example, rising edge 708 causes the data change on bus data signal 720 as shown at 710. The change in data shown at 710 represents the data changing on node 237 at the input of input synchronous element 320 (FIG. 3). The time delay between rising edge 708 and the data change shown at 710 is equal to the sum of Tco and Tsu of I/O device 218. This is shown at 730. In the embodiment shown in FIG. 7A, the falling edge of transmit clock signal 610 coincides with a rising edge of receive clock signal 616. For example, falling edge 714 occurs at time 706, and rising edge 712 also occurs at time 706. This timing relationship between transmit clock signal 610 and receive clock signal 616 is also shown in FIG. 6.

Rising edge 712 of receive clock signal 616 clocks data from bus data signal 720 into input synchronous element 320 (FIG. 3). In the example of FIG. 7A, rising edge 712, occurring at time 706, clocks in valid data shown as "data N."

FIG. 7B shows transmit clock signal 752, receive clock signal 780, and bus data signal 720. Transmit clock signal 752 and receive clock signal 780 are represented with reference numerals different than those used in FIG. 7A to indicate that the frequency of the signals is different than that shown in FIG. 7A. Rising edge 758 of transmit clock signal 752 causes a change in data on bus data signal 720. This is shown at 760. Falling edge 764 of transmit clock signal 752 coincides with rising edge 762 of receive clock signal 780. These edges occur at time 756. The frequency of transmit clock signal 752 and receive clock signal 780 have increased such that the apparent delay between transmit clock signal 752 and receive clock signal 780 has decreased to the point that time 756 roughly coincides with the data change shown at 760, and pulsewidth 754 is substantially equal to Tco+Tsu.

At clock frequencies between those represented by FIGS. 7A and 7B, valid data is captured by input synchronous element 320 (FIG. 3). As the frequency increases, however, the rising edge of receive clock signal 780 approaches the time at which data changes on bus data signal 720. This results in different data values being captured by input synchronous element 320.

Referring now back to FIG. 4, data on node 226 represents the data captured by input synchronous element 320. Data on node 454 represents test data from which bus data signal 720 is derived. Comparator 422 compares data on node 454 and 226 to determine whether rising edge 762 of receive clock signal 780 (FIG. 7B) is validly capturing data, or is attempting to capture data during data change 760. When the frequency has been increased to the point that data on nodes 454 and 226 do not match, then one half period of the core clock is substantially equal to the sum of Tco and Tsu as shown at 730 in FIG. 7A.

Embodiments represented by FIGS. 7A and 7B measure the sum of Tco and Tsu. Other embodiments, utilizing different apparent delays between the transmit clock signal and the receive clock signal can measure other timing parameters of I/O devices in integrated circuits. As discussed with reference to FIG. 6, different apparent time delays between the transmit clock signal and the receive clock signal can be generated by varying the appropriate control signals.

FIG. 8 is a flowchart of a method of testing an integrated circuit. Method 800 represents actions taken during the test of I/O devices in an integrated circuit. Method 800 begins at 810 when test data is shifted into a scan chain in an integrated circuit. Test data can be shifted into a padscan chain such as that shown in, and described with reference to, FIGS. 2, 3, and 4. In action 820, the integrated circuit is signaled to enter a test mode that provides separate transmit and receive clock signals. Action 820 can be taken by a component tester that, for example, signals a transmit clock generator and a receive clock generator within the integrated circuit to provide front side bus clock signals having an apparent time delay relative to each other, such as is shown in FIG. 6.

In action 830, the frequency of an external clock signal provided to the integrated circuit is increased, and in action 840, results data are shifted out of the integrated circuit. Action 830 corresponds to the difference between FIGS. 7A and 7B. FIG. 7A shows a transmit clock signal and a receive clock signal generated from an external clock signal at a particular frequency. FIG. 7B shows the same transmit clock signal and receive clock signal generated from a higher frequency external clock signal. A comparator within the integrated circuit generates results data while the frequency of the clock signals is increasing. When the external clock signal reaches a point at which one half period of the core clock signal is substantially equal to the sum of Tco and Tsu, the results data will begin to show errors, and method 800 will have measured the sum of Tco and Tsu.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An integrated circuit comprising:
   a clock input node to receive an external clock signal;
   a plurality of input sequential elements and a plurality of output sequential elements;
   a phase lock loop to create a core clock signal from the external clock signal; a transmit clock generator to generate a transmit clock signal from the core clock signal to clock the plurality of output sequential elements; and
   a receive clock generator to generate a receive clock signal from the core clock signal to clock the plurality of input sequential elements,
   wherein the transmit clock generator generates the transmit clock signal from a first phase of the core clock signal, and the receive clock generator generates the receive clock signal from an opposite phase of the core clock signal to create an apparent time delay between the receive clock signal and the transmit clock signal, such that the apparent time delay decreases as the external clock signal increases in frequency.

2. The integrated circuit of claim 1 wherein the receive clock generator includes an inverter to conditionally invert the core clock signal to generate the receive clock signal with an apparent time delay relative to the transmit clock signal.

3. The integrated circuit of claim 2 wherein the plurality of output sequential elements and input sequential elements are paired to form a plurality of input/output circuits such that testing of timing parameters of the plurality of input/output circuits can be influenced by varying the apparent time delay.

4. The integrated circuit of claim 3 wherein each of the plurality of input/output circuits includes a pattern generator to hold test data.

5. The integrated circuit of claim 4 wherein each of the plurality of input/output circuits includes a comparator to compare data from the respective pattern generator with data from the respective input sequential element.

6. The integrated circuit of claim 4 wherein the pattern generator comprises a shift register having an input node and an output node, the plurality of input/output circuits being coupled together such that each shift register is part of a padscan chain.

7. The integrated circuit of claim 6 further comprising a plurality of internal sequential elements coupled together to form a boundary scan chain, wherein the boundary scan chain is separate from the padscan chain.

8. A method comprising:
   inputting an external clock signal into an integrated circuit to produce transmit and receive clocks;
   receiving a signal to place an integrated circuit in a test mode;
   varying the external clock over a range of frequencies;
   in response to the test-mode signal, offsetting the transmit and receive clocks of the integrated circuit from each other by amounts dependent substantially entirely upon the frequencies of the external clock;
   inputting test data into the integrated circuit through a transmit synchronous element governed by the transmit clock and through a receive element governed by the receive clock so as to produce result data;
   comparing the input test data to the result data;
   measuring a time parameter of the integrated circuit in response to both the comparing and the frequencies of the external clock.

9. The method of claim 8 where offsetting includes creating an apparent delay for one of the transmit and receive clocks.

10. The method of claim 9 where creating an apparent delay includes selecting an inverse phase of one of the transmit and receive clocks.

11. The method of claim 9 further comprising producing the test data in a shift register located in the integrated circuit.

12. A test system, comprising:
    a component tester to signal a test mode, to produce an external clock at multiple different frequencies during the test mode, and to accept test results corresponding to the different frequencies;
    an integrated circuit including
    an output device with an output synchronous element responsive to a transmit clock and coupled to an I/O pad;
    an input device with an output synchronous element responsive to a receive clock and coupled to the I/O pad;
    a clock generator to produce the transmit and receive clocks from the external clock;
    a delay circuit responsive to the test mode to offset the transmit and receive clocks from each other by amounts dependent substantially entirely upon a frequency of the external clock supplied from the component tester;
    a test data generator to insert test data into the output device;
    a comparator to compare the inserted test data to data produced by the input device after passing through the output device and to send the test results to the component tester.

13. The system of claim 12 where the component test determines a time parameter of the integrated circuit from the test results corresponding to various ones of the external clock frequencies.

14. The system of claim 12 where the test generator includes a shift register coupled to the output device.

15. The system of claim 12 where the clock generator converts the external clock to a higher-frequency core clock, and produces the transmit and receive clocks from the core clock.

16. The system of claim 15 where the delay generator selectively inverts the core clock to produce one of the transmit and receive clocks during the test mode.

17. The system of claim 12 where the input synchronous element is coupled directly to the comparator.

18. An integrated circuit comprising:
- an output device with an output synchronous element responsive to a transmit clock and coupled to an I/O pad to output data from the integrated circuit in a normal mode;
- an input device with an output synchronous element responsive to a receive clock and coupled to the I/O pad to input data to the integrated circuit during a normal mode;
- a clock generator to produce the transmit and receive clocks from an external clock;
- a delay circuit responsive to a test mode to offset the transmit and receive clocks from each other by amounts dependent substantially entirely upon a frequency of the external clock;
- a test data generator responsive to the test mode signal to insert test data into the output device;
- a comparator to compare the inserted test data to data produced by the input device after passing through the output synchronous device.

19. The integrated circuit of claim 18 where the test data generator includes a shit register coupled to the output device.

20. The integrated circuit of claim 18 where the clock generator converts the external clock to a higher-frequency core clock, and produces the transmit and receive clocks from the core clock.

21. The integrated circuit of claim 20 where the delay generator inverts one of the transmit and receive clocks during the test mode.

22. The integrated circuit of claim 21 where the delay generator includes at least two parallel paths having different numbers of inverters, at least one of the inverters in each path being capable of producing a high-impedance output, one of the paths being selected in the normal mode, and the other of the paths being selected in the test mode.

23. The integrated circuit of claim 18 where the input synchronous element is coupled directly to the comparator.

* * * * *

UNITED STATES PATENT AND TRADEMARK OFFICE
CERTIFICATE OF CORRECTION

PATENT NO.   : 6,671,847 B1
DATED        : December 30, 2003
INVENTOR(S)  : Chao et al.

It is certified that error appears in the above-identified patent and that said Letters Patent is hereby corrected as shown below:

<u>Column 12,</u>
Line 5, delete "shit" and insert -- shift --, therefor.

Signed and Sealed this

Fifteenth Day of June, 2004

JON W. DUDAS
*Acting Director of the United States Patent and Trademark Office*